United States Patent [19]

Colomina

[11] Patent Number: 4,823,951

[45] Date of Patent: Apr. 25, 1989

[54] RETAINER FOR HOLDING A PRINTED CIRCUIT CARD BETWEEN SPACED SURFACES

[75] Inventor: Theodore S. Colomina, Monrovia, Calif.

[73] Assignee: EG&G, Inc., Wellesley, Mass.

[21] Appl. No.: 180,714

[22] Filed: Apr. 1, 1988

Related U.S. Application Data

[63] Continuation of Ser. No. 920,372, Oct. 20, 1986, abandoned.

[51] Int. Cl.⁴ .............................................. B65D 73/02
[52] U.S. Cl. ...................................... 206/328; 439/59
[58] Field of Search .................... 206/328; 211/41, 40, 211/42; 339/17 LM, 17 L, 65, 66 R, 75 MP

[56] References Cited

U.S. PATENT DOCUMENTS 3,970,198 7/1976 Prater .

OTHER PUBLICATIONS

EGG Birtcher Industrial Products Catalog, pages for Series 40, Lok-Tainer Wedge Style Card Mounts and Series 25 & 27 Lok-Tainers.

Primary Examiner—Joseph Man-Fu Moy
Attorney, Agent, or Firm—Finnegan, Henderson, Farabow, Garrett & Dunner

[57] ABSTRACT

A retainer is provided for holding a printed circuit card between spaced surfaces which comprises a plurality of wedge-shaped members mounted end-to-end on a rod, with at least select ones of those members being each urged in a corresponding transverse direction relating to the adjacent member upon effective shortening of the rod to hold the printed circuit card between the spaced surfaces. A spring is attached to each of the select members to bias those members each in a direction opposite the transverse direction for that member.

9 Claims, 2 Drawing Sheets

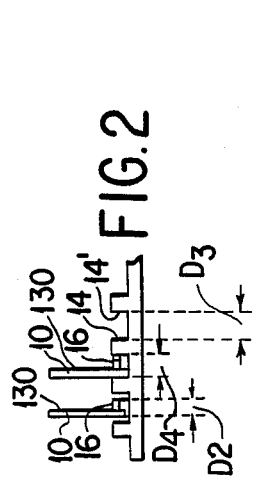
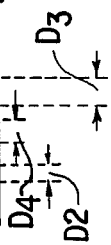
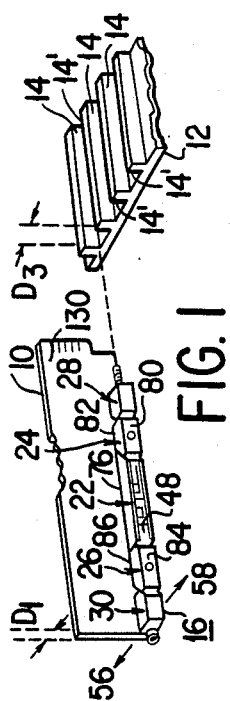
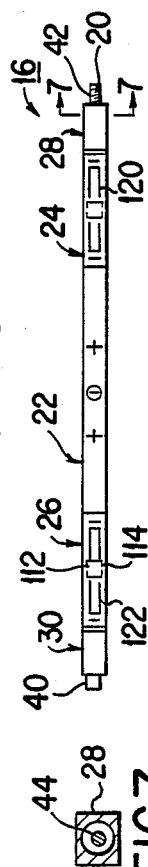
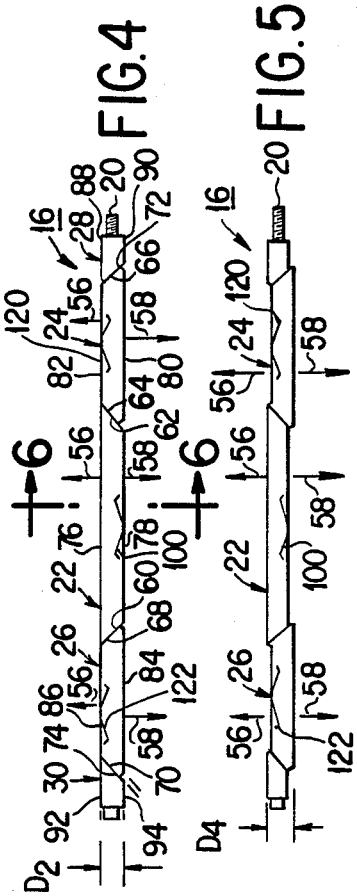
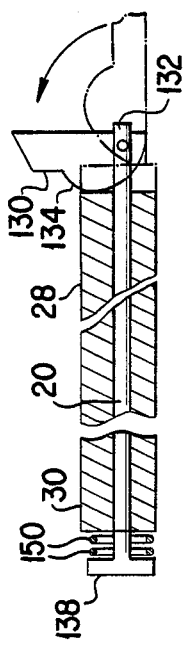

RETAINER FOR HOLDING A PRINTED CIRCUIT CARD BETWEEN SPACED SURFACES

This application is a continuation of application Ser. No. 920,372, filed Oct. 20, 1986.

BACKGROUND OF THE INVENTION

1. Field of the Invention

The present invention relates to a retainer for holding a printed circuit card between spaced surfaces and particularly to a retainer which facilitates entry and removal of a card from between those surfaces.

2. Background Information

As is well known to those skilled in the art, electronic equipment often employs printed circuit cards containing electrical circuitry. These cards are commonly mounted in a chassis or printed circuit card rack by stacking the cards in row alignment with one another. The row alignment is defined by slotted or spaced surfaces within or on the chassis, with each card placed between a pair of the spaced surfaces.

Printed circuit card retainers, for holding a printed circuit card between spaced surfaces, are known which comprise a partially threaded screw or a rod and three members slidably mounted end-to-end on the rod. The middle member has an internal longitudinal channel with a transverse dimension greater than the corresponding outside dimension of the rod to permit movement of the middle member along a transverse path relative the rod. The middle member and the adjacent end members have end portions which are engageable one another and shaped to force the middle member to move in a first direction along the transverse path relative the adjacent members upon forcing of the adjacent members toward the middle member.

To selectively force the adjacent end members toward the middle member, the rod of known prior art retainers comprises threads on one end and a shoulder on the other end. Recipient thread is provided on one of the end members to permit effective shortening of the rod upon rotation of the rod relative the one end member containing the recipient threads.

Prior art retainers of the type referred to above are designed to have a narrow width, when the middle member is not moved in the first direction along the transverse path, sufficient in size to permit insertion of the retainer and a card to which the retainer is mounted between the spaced surfaces on the chassis. Upon rotation of the rod and corresponding movement of the middle member in the first direction, the middle member engages one of the spaced surfaces and the card engages the other spaced surface and thereby holds the retainer and card between those spaced surfaces.

To remove the card from the chassis, the rod is rotated in a manner which relieves the forcing together of the adjacent members toward the middle member, thereby permitting the middle member to move in a direction opposite the first direction allowing the members of the retainer to assume a relaxed position and the card to be removed from between the spaced surfaces.

Although such prior art retainers are typically mounted on a printed circuit card, in the alternative the retainer could be mounted on one of the spaced surfaces, with the card inserted between the retainer and the other of the spaced surfaces. In addition, the middle member, in some prior art embodiments, actually comprises three or more members, arranged adjacent one another on the rod between the end members, with each of these "middle" members having end portions which are engageable to one another and shaped to expand the middle members, alternately, in a transverse path relative to the rod and the end members as the end members are forced toward the middle members.

Generally, space is at a premium where printed circuit cards are held. Therefore, the distance between stacked cards and the corresponding distance between spaced surfaces holding the cards must be designed to be an absolute minimum. The resultant available clearance between the spaced surfaces and the printed circuit card and retainer combination is therefore at a mimimum. Hence, when the members of a prior art retainer are in a relaxed position, insertion of the printed circuit card and retainer combination is hampered if the alignment of the members relative to one another is not maintained in an optimum position.

Misalignment of the members of a prior art retainer is caused by the individual members being able to rotate about the rod relative to one another when in the relaxed position. This results in some instances in the width of the retainer and card combination being greater than the distance between spaced surfaces. This discrepancy between the width of the retainer and card combination when in the relaxed position, and the distance between the spaced surfaces, results in the card not being freely insertable between the spaced surfaces, thereby causing excessive wear and tear on the retainer and card as a result of trying to force the retainer and card between the spaced surfaces.

Moreover, during shipping and handling of prior art retainers, individual members of such retainers are free to abrasively contact one another, thereby possibly damaging the finish on the members, resulting in rejection of otherwise useful retainers.

It is, accordingly, an object of the present invention to maintain the members of a printed circuit card retainer in a desired alignment relative one another when in the relaxed position during insertion and removal of a retainer and card combination between spaced surfaces, and during shipping and handling of the retainer.

Additional objects and advantages of the invention will be set forth in the description which follows and in part will be obvious from the description or may be learned by practice of the invention.

SUMMARY OF THE INVENTION

To achieve the foregoing object and in accordance with the purpose of the invention as embodied and broadly described herein, a retainer for holding a printed circuit card between spaced surfaces is provided comprising: a rod; a plurality of members slidably mounted end-to-end on that rod, with at least one of the members having an internal longitudinal channel with a transverse dimension greater than the corresponding outside dimension of the rod to permit movement of that one member along a first transverse path relative to the rod, the members adjacent that one member and that one member having end portions engageable one another and shaped to force that one member to move in a first direction along the first transverse path relative to the adjacent members upon forcing of the adjacent members toward the one member; a mechanism for selectively forcing the adjacent members toward the one member; and a spring mechanism, attached to that one member, for applying a spring bias between the rod and the one member opposing movement of the one member in the first direction.

Preferably the adjacent members each have there own internal longitudinal channel having a transverse dimension greater than the corresponding dimension of the rod to permit movement of each of those adjacent members along respective second and third transverse paths relative to the rod, with the end portions of the one member and the adjacent members shaped to align the transverse paths parallel to one another and to force the adjacent members to move in a second direction relative to the first member, opposite the first direction, upon forcing of the adjacent members toward the one member, and wherein the retainer further includes additional spring mechanisms each attached to respective ones of the adjacent members, for opposing movement of the adjacent members in the second direction.

Still further, a retainer of the subject invention includes first and second end members along the rod, one on either outside end of the adjacent members, with the end members each having end portions engageable with the end portions of the adjacent members and shaped to force the adjacent members to move in the second direction upon forcing of the end members toward one another. In this embodiment, the mechanism for selectively forcing includes the capacity to selectively force the end members toward the adjacent members.

Still further, the one member of a retainer incorporating the teachings of the subject invention preferably includes a first contact surface aligned to engage either a side of the card being held or a side of the spaced surfaces between which the card is held, and each adjacent member preferably has a second contact surface aligned to engage the other of the side of the card and the one of the spaced surfaces not engaged by the first contact surface of the one member, upon operation of the forcing mechanism. The adjacent members each preferably have a third contact surface, positioned on the side of the adjacent members opposite the second surface, to engage the side of the card or the one of the spaced surfaces engaged by the first contact surface in response to biasing of the spring mechanisms upon relaxation of the forcing mechanism to align the second contact surfaces in a position which facilitates insertion and removal of the card between the spaced surfaces.

BRIEF DESCRIPTION OF THE DRAWINGS

FIG. 1 is an illustration of a retainer incorporating the teachings of the subject invention mounted to a printed circuit card which is to be held between spaced surfaces;

FIG. 2 is an end view of the retainer, card and spaced surfaces illustrated in FIG. 1;

FIG. 3 is a back view of the retainer of FIG. 1;

FIG. 4 is a top view of the retainer of FIG. 1 in a relaxed position;

FIG. 5 is a top view of the retainer of FIG. 1 in an expanded position;

FIG. 7 is a cross-sectional view of the retainer of FIG. 3 taken along lines 7—7;

FIG. 10 is a side view of an alternative mechanism for selectively altering the effective length of a rod employed in a retainer incorporating the teachings of the subject invention.

DESCRIPTION OF THE PREFERRED EMBODIMENT

Figure 8:
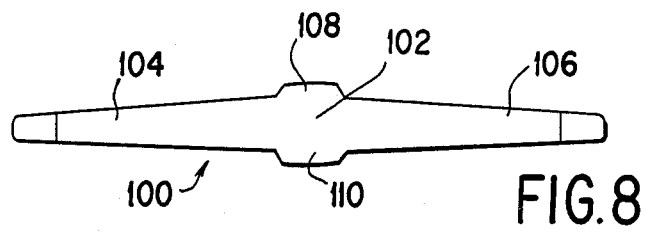
FIG. 8 is the top view of a leaf spring used in accordance with the teachings of the subject invention.

Reference will now be made in detail to the present preferred embodiment of the invention as illustrated in the accompanying drawings.

FIG. 1 provides a perspective view of a printed circuit card 10, a chassis 12 upon which there is formed a plurality of paired spaced surfaces 14, 14', and a retainer 16 incorporating the teachings of the subject invention. As will described in more detail below, the effective width of D1 (FIG. 1) of the combination of card 10 and retainer 16 is variable between a relaxed position first width dimension D2 illustrated in FIG. 2 which is less than the width D3 between space surfaces 14, 14' and an expanded position second width D4 which is approximately equal to D3. With card 10 and retainer 16 having a relaxed position width D2, the combination of card 10 and retainer 16 may be easily inserted into and removed from spaced surfaces 14, 14'. When the combination of card 10 and retainer 16 is in an expanded position having an effective width D4 which is equal to width D3 of spaced surfaces 14, 14', retainer 16 operates to hold printed circuit card 10 between surfaces 14, 14'.

As may be seen in FIGS. 3, 4, 5, and 6, retainer 16 comprises a rod 20, a middle member 22, adjacent members 24 and 26, and end members 28 and 30. Members 22, 24, 26, 28 and 30 are each slidably mounted end-to-end on rod 20. Rod 20 has a headed first end 40 and threaded second end 42.

End member 28, as may be seen in FIG. 7, includes a threaded portion 44 corresponding to the threads on threaded second end 42 of rod 20. Thus, the effective length of rod 20 may be altered by rotating rod 20 relative end 28. To facilitate this rotation, headed first end 40 may include a wrench or screw driver receiving aperture, or the like, to facilitate rotation of rod 20. In the alternative, a standard nut may be inserted over threaded second end portion 42 and rotation of rod 20 relative this nut will selectively alter the effective length of rod 20. As used herein the term effective length is intended to mean the length of rod 20 available for members 22, 24, 26, 28 and 30.

Figure 6:
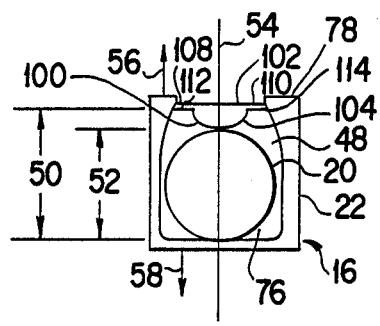
FIG. 6 is a cross-sectional of the retainer of FIG. 1 taken along line 6—6 of FIG. 4.

Each of members 22, 24 and 26 has an internal longitudinal channel 48 having a transverse dimension 50 which, as shown in FIG. 6 with regard to member 26 by way of example, is greater than the corresponding outside dimension 52 of rod 20, to permit movement of each member 22, 24 and 26 along a transverse path identified by line 54 in FIG. 6 relative to rod 20.

In addition, members 22, 24, 26, 28 and 30 each have end portions engageable one another and shaped to force members 22 28 & 30 to move in a first direction illustrated by arrows 56 along transverse path 54 relative adjacent members 24, 26. In addition, the end portions of members 22, 24, 26, 28 and 30 are also shaped to force adjacent members 24 and 26 to move in a second direction, illustrated by arrow 58, relative member 22, opposite to the first direction represented by arrows 56, upon forcing of adjacent members 24 and 26 toward member 22.

Specifically, member 22 has end surfaces 60, 62; member 24 has end surfaces 64, 66; member 26 has end surfaces 68, 70; end member 28 has end surface 72; and end member 30 has surface 74 as is illustrated in FIG. 4. As may be also seen in FIG. 4 surfaces 60, 62 of middle member 22 define a portion of a trapezoidal longitudinal cross-section of member 22 which also includes an elongated surface 76 and oppositely facing shorter surface 78; surfaces 64 and 66 of adjacent member 24 define a portion of a trapezoidal longitudinal cross-section of member 24 which also includes an elongated surface 80 and oppositely facing shorter surface 82; surfaces 68 and 70 of member 26 define a portion of a trapezoidal longitudinal cross-section of member 26 which also includes an elongated surface 84 and an oppositely facing shorter surface 86; surface 72 of end member 28 defines a portion of a trapezoidal longitudinal cross-section of member 28 which also includes an elongated surface 88 and an oppositely facing shorter surface 90; while surface 74 of end member 30 defines a portion of a trapezoidal longitudinal cross-section of member 30 which also includes an elongated surface 92 and an oppositely facing shorter surface 94.

Upon effective shortening of rod 20 by rotation of rod 20 relative threaded end portion 28, surfaces 60, 68; 62, 64; 66, 72; and 70, 74 engage one another to force middle members 22 28 & 30 in a first direction indicated by arrows 56 and to force adjacent members 24 and 26 in a second direction indicated by arrows 58 relative one another, thus, effectively increasing the width of retainer 16 from a relaxed position width D2 as illustrated in FIG. 4 and 2 to a greater expanded position width D4 as illustrated in FIGS. 5 and 2. Relaxed position width D2 plus the width D1 of board 10 (FIG. 1) is less than the width D3 between spaced surfaces 14, 14' illustrated in FIGS. 1 and 2, whereas expanded position width D4 plus the width D1 of board 10 is made equivalent to or greater than width D3 between spaced surfaces 14, 14'. Thus, in the expanded position of FIG. 5, retainer 16 holds board 10 between spaced surfaces 14, 14'.

Unfortunately, upon relaxation of retainer 16 from the expanded position illustrated in FIG. 5, there is no mechanism for assuring that members 22, 24, 26, 28 and 30 will necessarily and immediately align themselves to assume the relaxed position of those members as illustrated in FIG. 4. Thus, removal of retainer 16 and board 10 from between the space surfaces 14, 14' of FIG. 1 is made difficult. In addition, with members 22, 24, 26, 28 and 30 in the relaxed position illustrated in FIG. 4, there is no mechanism for assuring that the relative alignment of members 22, 24, 26, 28 and 30 as illustrated in FIG. 4 will be maintained. Instead, members 22, 24, 26, 28 and 30 are free to rotate at least partially about rod 20, thereby presenting a transverse dimension greater than distance D2 illustrated in FIG. 4, thus jeopardizing the ability of the combination of retainer 16 and board 10 to be readily asserted between spaces 14, 14' of FIG. 1.

In accordance with the teachings of the invention, a spring mechanism is provided which is attached to at least one transversely movable member of a printed circuit card retainer to apply a spring bias between that one member and a rod on which that one member is mounted to oppose transverse movement of that one member in the direction that one member tends to move upon activation of the retainer.

Figure 9:
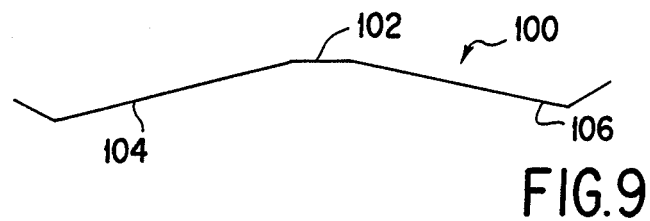
FIG. 9 is a side view of the leaf spring illustrated in FIG. 8.

By way of example and not limitation, there is illustrated in FIGS. 8 and 9 a leaf spring 100 which comprises a central portion 102, two end portions 104, 106 and tab portions 108, 110 extending outwardly from central portion 102. Leaf spring 100 is mounted in member 22 and is representative of leaf springs 120 and 122 which are likewise mounted in members 24 and 26, respectively.

Figure 11:
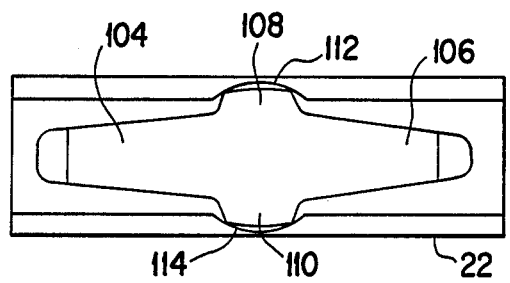
FIG. 11 is a top view of the leaf spring illustrated in FIG. 8 mounted in a member of the retainer of FIG. 1.

As may be best seen in FIGS. 6 and 11 each member 22, 24 and 26 has a pair of centrally located notches 112, 114, formed as arcs, into which tab portions 108, 110 of respective springs 100, 120 and 122 are fitted. Spring 100 is shown in FIG. 6 mounted in arched notches 112, 114 of middle member 22 in a position between middle member 22 and rod 20 which biases middle member 22 in a second direction relative rod 20 which, as illustrated by arrows 58, is opposite the first direction represented by arrows 56. In other words, members 24 and 26 operate upon effective shortening of rod 20 to force middle member 22 in the direction illustrated by arrows 56 whereas spring 100 operates to bias middle member 22 in the opposite direction illustrated by arrows 58.

Springs 120 and 122 are similar to spring 100 but are mounted in members 24 and 26, respectively, as illustrated in FIGS. 3 and 5 to bias adjacent members 24 and 26 in the first direction illustrated by arrows 56. Thus, when the effective length of rod 20 is shorted, surfaces 60 through 74 operate to force adjacent members 24 and 26 in the second direction illustrated by arrows 58 whereas springs 120 and 122 operate to bias adjacents members 24 and 26 in the opposite first direction represented by arrows 56.

The operation of springs 100, 120 and 122 tends to urge members 22 through 30 into alignment in the relaxed position illustrated in FIG. 4 in the absence of longitudinal forces resulting from the effective shortening of rod 20. Specifically, springs 120 and 122 bias surfaces 54, 66 and 68, 70 towards corresponding surfaces 62, 72 and 60, 74, whereas spring 100 biases surfaces 60, 62 towards corresponding surfaces 64, 68. The interaction of these surfaces under the biasing of springs 100, 120 and 122, tends to fix members 22, 24, 26, 28 and 30 in the relaxed arrangement illustrated in FIG. 4, thus facilitating insertion and removal of retainer 16 and card 10 from between space surfaces 14, 14' of FIG. 1.

In operation of retainer 16, elongated surface 76 of middle member 22 is aligned to engage either one side of card 10 or one of spaced surfaces 14, 14'. As illustrated in FIG. 1, surface 76 is shown aligned to engage side 130 of card 10. Preferably, surface 76 is actually affixed to surface 130 of card 10 through utilization of a screw or other fastening mechanism not shown. In the alternative, surface 76 may be aligned to engage either surface 14, 14' of chassis 12.

In any event, adjacent members 24 and 26 each have an elongated surface 80, 84 which is aligned to engage that surface of card 10 and chassis 12 not contacted by elongated surface 76 of middle member 22. For example, as illustrated in FIG. 1, with surface 76 of middle member 22 contacting surface 130 of board 10, surfaces 80, 84 of adjacent members 24, 26 are aligned to engage surface 14' of chassis 12.

Shorter surfaces 82, 86 of adjacent members 24, 26 are positioned on the side of adjacent members 24, 26 opposite elongated surfaces 80, 84 as illustrated in FIGS. 1 and 4 to engage that surface of board 10 or chassis 12 which surface 76 of middle member 22 engages when retainer 16 is in the relaxed position of FIG. 1 or 4. Specifically, as illustrated in FIG. 1, surfaces 82, 86 engage surface 130 of card 10 in response to the biasing of adjacent members 24 and 26 in the first direction illustrated by arrows 56. The contacting of surfaces 82, 86 against surface 130 of board 10 under the influence of springs 120 and 122 further assists in the alignment of members 22, 24, 26, 28 and 30 in the relaxed position illustrated in FIG. 4.

The effective length of rod 20 may be altered through operation of a threaded mechanism as described above. However other mechanisms for altering the effective length of rod 20 may be employed. For example, in FIG. 10 there is illustrated a cam 130 pivotally mounted to a first end 132 of rod 20 adjacent end member 28. Cam 130 has a cam surface 134 which permits effective shortening of rod 20 upon rotation of cam 130 relative rod 20. The other end 136 of rod 20 may, for example, include a headed portion 138 to limit movement of end member 30 relative to rod 20. Bellville washers 150, or the like, are interposed between headed portion 138 and end member 30 to act as a compression spring to permit over center locking of cam 130.

Although a retainer employing a total of five members was disclosed above, retainers with less or more members are also contemplated, depending on the length of the card to be mounted.

Additional advantages and modifications will readily occur to those skilled in the art. The invention in its broader aspects is, therefore, not limited to the specific details, representative apparatus and illustrative examples shown and described. Accordingly, departures may be made from such details without departing from the spirit or scope of applicant's generic invention concept.

I claim:

1. A retainer for holding a printed circuit card between spaced surfaces comprising:
   a rod;
   a plurality of members slidably mounted end-to-end on said rod, at least one of said members having an internal longitudinal channel having a transverse dimension greater than the corresponding outside dimension of said rod to permit movement of said one member along a transverse path relative said rod, said one member and members adjacent said one member each having end portions engageable one another and shaped to force said one member to move in a first direction along said transverse path relative said adjacent members upon forcing of said adjacent members toward said one member;
   first means for selectively forcing said adjacent members towards said one member; and
   second means, attached to said one member, for applying a spring bias between said rod and said one member opposing movement of one member in said first direction.

2. A retainer of claim 1 wherein said end portions of said one member and said end portions of said adjacent members, upon contact with each other, radially align said one member and said adjacent members relative one another along said rod; said adjacent members each have an internal longitudinal channel having a transverse dimension greater than the corresponding outside dimension of said rod to permit movement of said adjacent members along respective transverse paths relative said rod, with said end portions of said one member and said adjacent members shaped to force said adjacent members to move relative said first member along said respective transverse paths in a second direction, opposite said first direction, upon said forcing of said adjacent members towards said one member; and wherein said retainer further includes third and fourth means, each attached to a respective one of said adjacent members, for applying a spring bias between said rod and said adjacent members, respectively, opposing movement of said adjacent members in said second direction.

3. A retainer of claim 2 wherein said plurality of members includes first and second end members positioned along said rod one on either outside end of said adjacent members, said end members each having end portions engageable with said adjacent members and shaped to force said adjacent members to move in said second direction upon forcing of said end members towards said adjacent members; and
   said first means includes means for selective forcing said end members toward said adjacent member.

4. A retainer of claims 2 or 3 wherein: (i) said one member has a first contact surface aligned to engage either a side of said card or one of said spaced surfaces and (ii) said adjacent members each have a second contact surface aligned to engage the other of said side of said card and said one of said spaced surfaces, upon said forcing of said first means.

5. A retainer of claim 4 wherein said adjacent members each have a third contact surface positioned on a side of said adjacent members opposite said second contact surface to engage said either a side of said card or one of said spaced members engaged by said first contact surface in response to biasing of said third and fourth means upon relaxation of said first means, to align said second contact surfaces in a position which facilitate insertion and removal of said card between said spaced surfaces.

6. A retainer of claim 3 wherein said first means comprises threads on one end of said rod and recipient threads on said first end member to permit effective shortening of said rod upon rotation of said rod relative said recipient threads.

7. A retainer of claim 3 wherein said first means comprises a cam having a cam surface located between said first end member and said rod to permit effective shortening of said rod upon rotation of said cam relative said rod.

8. In a retainer for holding a printed circuit card between spaced surfaces having a plurality of wedge-shaped members mounted end-to-end on a rod, with a least one of said members being urged in a transverse direction relative to the adjacent members upon effective shortening of the rod to hold the printed circuit card between the spaced surfaces, wherein the improvement comprises:
   a spring attached to each said at least one member to bias said member in a direction opposite said transverse direction for that member.

9. The retainer of claim 8, wherein at least three of said members are each urged in a respective transverse direction relative to the adjacent members upon effective shortening of the rod, with the transverse direction of each member being opposite the transverse direction of an adjacent member.

* * * * *

UNITED STATES PATENT AND TRADEMARK OFFICE
CERTIFICATE OF CORRECTION

PATENT NO. : 4,823,951

DATED : April 25, 1989

INVENTOR(S) : Theodore S. Colomina

It is certified that error appears in the above-identified patent and that said Letters Patent is hereby corrected as shown below:

Claim 8, col. 8, line 48, change "a" (second occurrence) to --at--.

Signed and Sealed this

Twenty-third Day of April, 1991

*Attest:*

HARRY F. MANBECK, JR.

*Attesting Officer*  *Commissioner of Patents and Trademarks*